United States Patent
Hishiro et al.

(10) Patent No.: US 8,163,468 B2
(45) Date of Patent: Apr. 24, 2012

(54) METHOD OF REDUCING PHOTORESIST DEFECTS DURING FABRICATION OF A SEMICONDUCTOR DEVICE

(75) Inventors: Yoshiki Hishiro, Sunnyvale, CA (US); Lijing Gou, Bosie, ID (US); Scott E. Sills, Boise, ID (US); Hiroyuki Mori, Boise, ID (US); Paul D. Shirley, Meridian, ID (US); Troy V. Gugel, Boise, ID (US); Adam L. Olson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1067 days.

(21) Appl. No.: 12/045,373

(22) Filed: Mar. 10, 2008

(65) Prior Publication Data

US 2009/0226847 A1 Sep. 10, 2009

(51) Int. Cl.
*G03F 7/26* (2006.01)
(52) U.S. Cl. ........................................ 430/327; 430/322
(58) Field of Classification Search .................. 430/311, 430/327
See application file for complete search history.

(56) References Cited

U.S. PATENT DOCUMENTS

| 6,037,201 A | 3/2000 | Tsai |
| 6,627,588 B1 | 9/2003 | Hess |
| 7,125,783 B2 | 10/2006 | Lo |
| 2005/0202351 A1 | 9/2005 | Houlihan |
| 2007/0002296 A1 | 1/2007 | Chang |
| 2007/0077516 A1 | 4/2007 | Chang |
| 2007/0117040 A1 | 5/2007 | Brock |

OTHER PUBLICATIONS

Wei, Yayi et al., 193nm Immersion-Related Defects and Strategies of Defect Reduction, Future Fab Intl., Jan. 9, 2007, vol. 22, www.futurefab.com/documents.asp?d_ID=4221.
Peters, Laura, Weeding Out Immersion-Type Defects, Semiconductor International, May 1, 2007, www.reed-electronics.com/epp/article/CA6434706?industryid=3033.
Lithography—resist fundamentals, IMEC Scientific report 2006, imec.be/wwwinter/mediacenter/en/SR2006/681408.html.

*Primary Examiner* — Kathleen Duda
(74) *Attorney, Agent, or Firm* — Michael E. Romani

(57) ABSTRACT

Reducing or eliminating watermark-type defects during semiconductor device fabrication are described and can comprise treating photoresist using one of several embodiments. In some embodiments, the propensity for defect formation is reduced/eliminated by conditioning the photoresist surface through the application and removal of a sacrificial overcoat. In other embodiments, existing defects are reduced/eliminated by exposing the photoresist surface to a defect-stripping material during post-develop processing.

8 Claims, 4 Drawing Sheets

METHOD OF REDUCING PHOTORESIST DEFECTS DURING FABRICATION OF A SEMICONDUCTOR DEVICE

TECHNICAL FIELD

Various embodiments of the present invention relate to the field of semiconductor manufacture and, more particularly, to a method for treating a photoresist material formed over a semiconductor wafer to reduce manufacturing defects.

BACKGROUND

During the formation of a semiconductor device many features such as conductors, electrical contacts, and other physical features are commonly formed from, into, and over a semiconductor wafer. A goal of semiconductor device engineers is to form as many of these features in a given area as possible to increase yield percentages and to decrease device size and manufacturing costs.

Heterogeneous structures on a semiconductor wafer are typically formed using lithography. Photolithography, the lithographic method most used in leading-edge wafer processing, comprises projecting coherent light of a given wavelength from an illumination source through a quartz photomask or reticle having a chrome pattern thereon, and imaging that pattern onto a photoresist-coated wafer. The light chemically alters the photoactive photoresist and allows the exposed photoresist (if positive resist is used) or the unexposed photoresist (if negative resist is used) to be rinsed away using a developer.

Generally, photolithography is a multi-step process including the application of a photoresist material to the surface of an in-process wafer, exposure of such material by a coherent light through a mask or reticle, and development of the exposed material, resulting in the desired patterning. Initially, photoresist material is applied to the surface of a wafer through processes known in the art, for example by a spin-on process. The wafer is then baked, hardening the resist and then exposed to a light source. Following, exposure, the wafer is subjected to a post exposure bake. A develop/rinse step follows, resulting in the removal of exposed (positive) or unexposed (negative) resist. The wafer is then dried by methods known in the art, for example by spin drying and then subjected to an after develop inspection ("ADI").

With decreasing feature sizes, the limits of photolithography are continually being tested and lithographic methods and materials are continually being improved through various developments such as resolution enhancement techniques, for instance immersion photolithography. As feature sizes continue to decrease, reduction of defect modes becomes increasingly important because tolerances are minimized with miniaturization of device features. It is well established that physical defects which have little impact on larger device features may result in nonfunctional devices when formed at smaller dimensions.

During ADI, a defect known as a watermark-type defect is often identified. This defect is likely an aberration which remains on the photoresist surface after standard dry or, immersion photolithographic processing. The defect likely results from materials, such as water used during the develop/rinse step, remaining on the resist surface. The appearance of a watermark-type defect likely depends on the probability that such materials will remain on the resist surface following the photolithographic process. The presence of such a defect can result in anomalies during subsequent processing, for example blocked etch, missing implant and/or undesirable topography, which may lead to lower yields and decreased device performance.

Accordingly, there is a need for improved photolithographic techniques to reduce or eliminate watermark-type defects.

Figure 1:
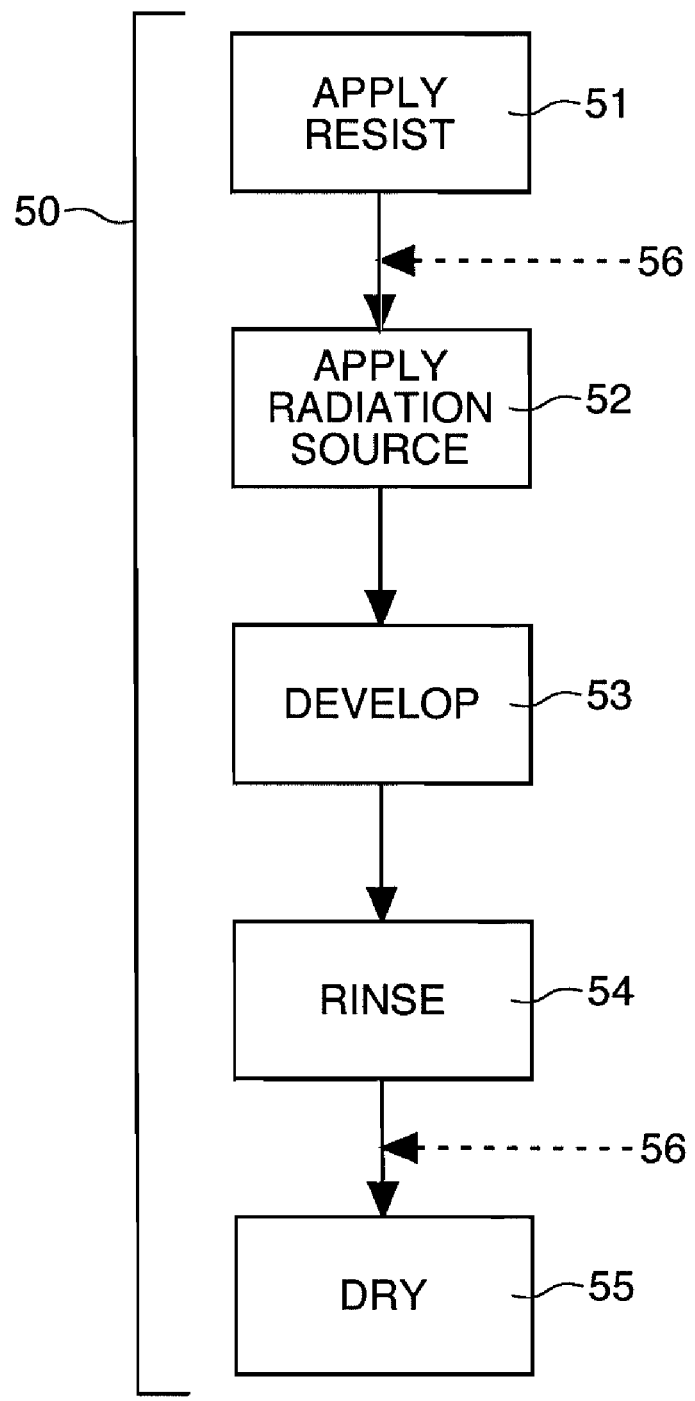
FIG. 1 is a flow chart depicting the process flow of a photolithographic process identifying process steps where the disclosed treatments may be applied.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" or "substrate" area interchangeable and are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" and/or "substrate" in the following description, previous process steps may have been utilized to form regions or junctions in or over the base semiconductor structure or foundation. Additionally, when reference is made to a "substrate assembly" in the following description, the substrate assembly may include a wafer with materials including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two materials, one "on" the other, means at least some contact between the materials, while "over" means the materials are in close proximity, but possibly with one or more additional intervening materials such that contact is possible but not required. Neither "on" nor "over" implies any directionality as used herein unless stated as such. The term "conformal" describes a coating material in which angles of the underlying material are preserved by the conformal material. The term "about" indicates that the value listed may be somewhat altered, as long as the alteration does not result in nonconformance of the process or structure to the illustrated embodiment of the present invention.

Additionally, the term "watermark-type defect" or "watermark" are interchangeable and generally refer to any defect present on the surface of a photoresist material identified during after develop inspection ("ADI") and occurring during any photolithographic process known in the art, including but not limited to, dry or immersion lithography. As used herein, such defects may range in size from 1 to 10 microns, but can be larger or smaller. Generally, watermark-type defects can be aberrations resulting from the presence of water or other material remaining on the resist surface following a develop/ rinse step. Such defects can also result from other causes, for example, the swelling of the resist material due to water diffusion, or solute leaching with subsequent precipitation and crystallization, among others. Although these mechanisms of defect formation are initiated during the develop/ rinse step, defects are not observed until wafer drying occurs.

Referring to FIG. 1, during photolithography processing 50 of a semiconductor wafer, a photoresist (resist) 51 is applied over the wafer. The wafer is then exposed to a wavelength of light (radiation source) 52 which passes through a quartz mask or reticle having a chrome pattern thereon. A developer 53 is then applied to the wafer. For positive photoresist, the resist is subjected to a develop process and exposed material is removed. If a negative photoresist is used, unexposed material is removed during the develop process. Subsequently, the wafer is rinsed 54 to remove any remaining developer, exposed (or unexposed) photoresist, and other contaminants which may remain over the wafer. Following the rinse step, the wafer is subjected to a drying step 55.

With continued reference to FIG. 1, flow insertion points for pre- and post-development processes 56 for treatment of the wafer to mitigate watermark-type defect formation are identified. Treatment may occur proceeding, during and/or following the develop/rinse/dry steps 53, 54 and 55. According to embodiments of the present invention, pre- and post-exposure treatments are contemplated. Without being held to any particular theory of defect prevention or reduction, in some embodiments, an increase in resist surface roughness following treatment likely interrupts the defect formation mechanism so as to mitigate or prevent formation of watermark-type defects. In other embodiments, chemical removal of watermark-type defects may be the mechanism of defect mitigation.

While the processes below are described with reference to positive resists, it should be noted that the processes may be modified if necessary for use with negative resists. This may be accomplished through the use of different materials, masks or reticles, etc.

Figure 2:
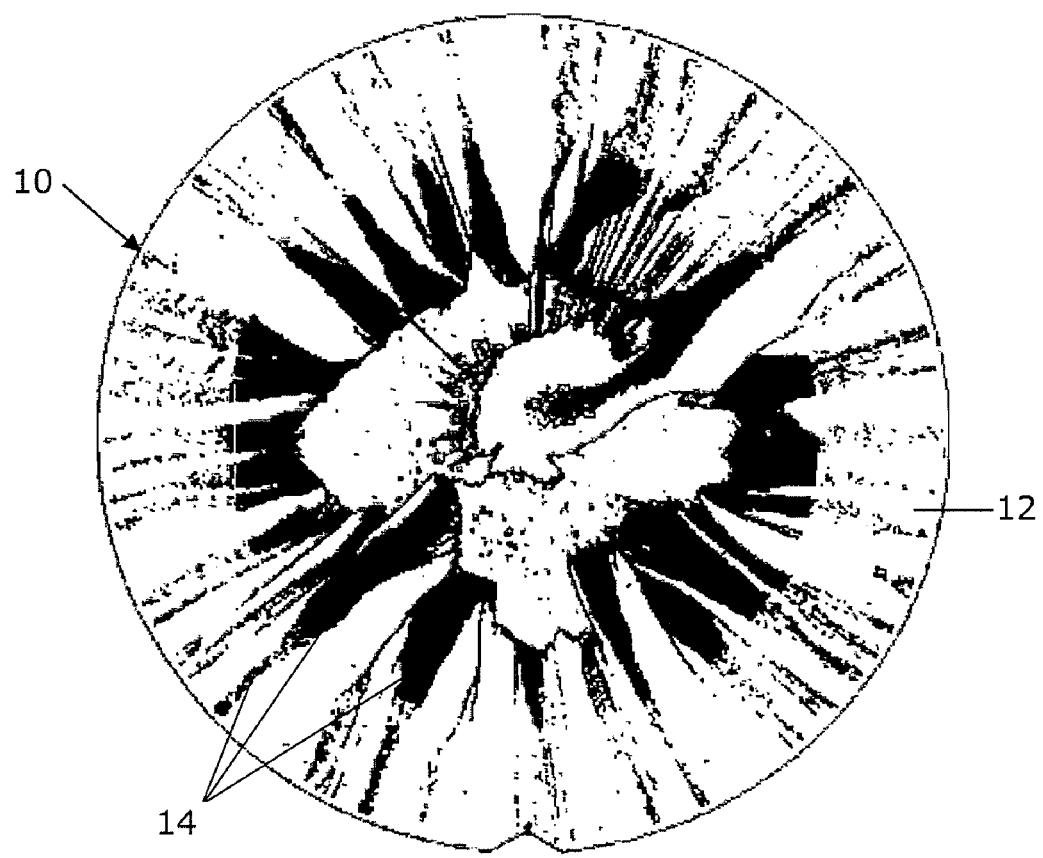
FIG. 2 is a plan view of a semiconductor wafer exhibiting a watermark-type of defect.

Watermark-type defects have been identified during ADI following photolithographic processing. The defect remains on the photoresist surface, as well as the open areas of the wafer where the resist has been removed. It is most prevalent on dark materials such as resist or bottom anti-reflective coating ("BARC"). This type of defect may be identified through visual inspection using, for example, scanning electron microscopy ("SEM") or through electrical inspection, for example, with an opti-probe tool. Resulting defects are depicted in FIG. 2, in which a semiconductor wafer 10 comprises a photoresist material 12 with defect areas 14 depicted as dark areas on the photoresist material 12. A watermark-type of defect is different from other known photolithographic defects, for example, coat defects, in that the watermark-type defect occurs subsequent to the coat process, is located on the surface of a coat material, and is not present on the coat material surface prior to the wafer undergoing the develop/rinse step following photolithographic exposure.

While being measurable, this defect has largely been ignored in the past as having little or no impact on device function during subsequent processing. This is likely due to the larger scale of previous feature size or device node. However, with the formation of sub-micron features, the watermark-type defect may be associated with an increase of subsequent possessing defects across the wafer and a potential decreases in yields. For example, the watermark-type defect may correlate with other defects such as blocked etch, missing implant and/or undesirable topography. Further, the watermark-type defect may prevent the detection of other defects by obscuring or masking detectability of other defect issues at contemporary or lower process levels in the semiconductor stack. Watermark-type defects may be aberrations that remain on the surface of a photoresist material after photolithographic processing known in the art, for example immersion or dry lithography. In both dry and immersion photolithography, the defects may occur as a result of water droplets remaining on the photoresist surface following post-exposure processing, such as develop/rinse steps of standard lithographic processing. The present disclosure provides methods for mitigating and/or preventing the formation of watermark-type defect.

In one embodiment, a wafer undergoes secondary processing following a primary process known in the art of standard photolithographic processing to reduce or eliminate the number and size of watermark-type defects which remain following the primary process. Primary processing generally includes: the application of a photoresist to the surface of a wafer, subjecting the coated wafer to a pre-exposure bake to harden the photoresist, exposure of the photoresist to a light source, subjecting the exposed photoresist to a post-exposure bake, developing and rinsing the photoresist and drying the wafer following the develop/rinse step (see FIG. 1).

Watermark-type defect mitigation according to described embodiments, may involve post-develop treatments which may include additional processing steps. These additional steps may occur in sequence with the described primary process and/or replace certain portions of the primary process. Post-develop treatments may expose the developed photoresist surface to one or more chemical or solvent treatments, which may result in the reduction or elimination in the size and number of watermark-type defects. Such post-develop treatments may be applied following, for example, the dry processing step or applied prior to the dry step and following the develop/rinse step.

In accordance with one embodiment of the invention following primary processing, the photoresist surface, which may also include exposed wafer surfaces, is treated to remove the defect subsequent to a develop/rinse step. The disclosed treatment(s) can be performed on the lithographic tool or on a separate tool. Subsequent to develop and rinse, the wafer surface may be exposed to a solution comprising one or more of isopropyl alcohol ("IPA"), hydrofluoric acid ("HF"), and/or a buffered oxide etch ("BOE"), for example an oxide etch comprising an HF-water solution with ammonium fluoride ("$NH_4F$"), added to prevent depletion of fluorine during oxide etching. In another embodiment, subsequent to the dry processing step, the wafer surface may be exposed to a solution comprising one or more of IPA, HF or BOE.

In another embodiment, the semiconductor wafer is placed into undiluted IPA vapor for a duration of between from about 1 seconds and to about 30 seconds. After removing the wafer from the IPA bath, it is dried using conventional techniques, for example nitrogen gas flow or via a Marangoni dryer. Such can occur subsequent to the develop/rinse step or subsequent to the dry step.

In another embodiment, the wafer is spun and undiluted IPA is dispensed onto the wafer. The wafer may be spun at from between about 30 rpm to about 2000 rpm. During the spinning, from between about 1 cc and to about 50 cc of undiluted IPA can be dispensed onto the wafer over a duration of between from about 1 seconds and to about 10 seconds. Such can occur subsequent to the develop/rinse step or subsequent to the dry step.

Additionally, IPA may be useful to remove the watermark-type defects by using a bath or by dispensing the solution onto the surface of the wafer. In one embodiment, equal amounts of water and pure IPA are used to remove the defect. Generally, a mixture of water and IPA such that the IPA comprises more than about 25% by volume would be sufficient, and more preferably will comprise about 50% or more by volume. In a 25% solution of IPA and water, from between about 2 cc to about 100 cc of the solution may be dispensed onto the wafer over a duration of between from about 1 seconds to about 20 seconds at ambient temperature and pressure. The application at various concentrations may be determined by one of ordinary skill in the art with a minimum of experimentation.

In another embodiment, dilute HF is used to remove the defects in the manner described above for the IPA. A solution comprising pure HF:water at a ratio of between about 1:10 and about 1:500 by volume, and more particularly at a ratio of between about 1:100 and about 1:500, would be sufficient. The wafer may be placed into a bath of the solution for a duration of from between about 30 seconds to about 300 seconds, or the solution may be dispensed onto the surface of a spinning wafer.

In yet another embodiment, dilute BOE is used to remove the defects in the manner described above for the IPA. A solution comprising pure BOE:water at a ratio of between about 1:0.01 to about 1:100 by volume, and more particularly at a ratio of between about 1:10 and about 1:100, would be sufficient. The wafer may be placed into a bath of the solution for a duration of between about 30 seconds and about 300 seconds, or the solution may be dispensed onto the surface of a spinning wafer.

Secondary (post-develop) processing of an exposed substrate which expose the surface of the deposited photoresist to one or more of the disclosed materials likely results in surface stripping or dissolution of the defect and is dependent of the specific treatment applied.

Although the disclosed has been described with treatment of the wafer by one material at a time, the invention is not so limited. Combination of more than one of the described materials is also contemplated.

Figure 3:
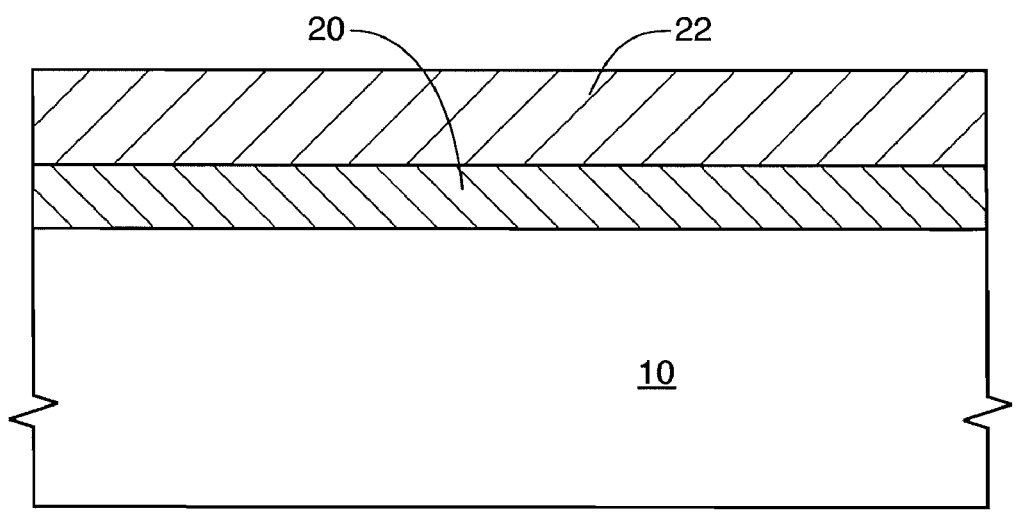
FIG. 3 is a cross-sectional view of a semiconductor wafer having a photoresist formed thereon and an overcoat formed thereover.

Another embodiment is depicted in FIG. 3. In this embodiment, a sacrificial overcoat is used as a treatment to reduce or eliminate formation of the watermark-type defect. Overcoats are known in the lithographic arts and are generally used as a barrier material to prevent leaching of potential contaminants, for example, the top coat used during immersion photolithography. Additionally, overcoats can also be used as a top anti-reflective coating (TRAC) to prevent the reflection of light during the photolithographic process.

As depicted in FIG. 3, a semiconductor wafer 10 having one or more underlayers thereon to be patterned (not individually depicted) is coated with a non-patterned photoresist 20 which is then cured, for example using a bake process. For various embodiments of the present invention, a commercially available photoresist such as P6III would be useful. Subsequently, overcoat 22 is formed over the unexposed photoresist 20 which is then cured, for example using a bake process. An overcoat may comprise any polymer which forms an inter-diffused (mixed) interface with the photoresist, and which results in a roughening of the photoresist surface after subsequent removal of the overcoat. According to embodiments of the invention, for example, an overcoat for either dry or immersion lithographic processing may comprise a commercially available immersion top-coat, e.g. TCX 041, other polymers such as fluorinated methacrylates comprising methyl-methacrylate backbones with F-group and/or $CF_3$-group side chains, alcohol-based materials, such as hexafluoro alcohol, etc. Overcoats may be applied onto the photoresist via spin-on or other known methods to a thickness of from about 10 Å to about 2000 Å, with a thickness of from about 200 Å to about 400 Å as useful. The overcoat may be soluble in the photoresist developer, or can be solvent soluble.

After application of the overcoat 22, the wafer is subjected to the primary process described above. The overcoat material may be removed during the photoresist develop step or during an independent process prior to the final photoresist develop/rinse sequense. During the develop process the overcoat and resist are exposed to an alkaline developer such as tetra-methyl-ammonium hydroxide ("TMAH") and a rinse using DI water to remove the dissolved overcoat and the exposed resist. The conditions of the underlying photoresist surface following removal of the overcoat material are such that the probability for watermark-type defect development is reduced or eliminated.

Subsequently, the underlayer to be patterned may be etched using the photoresist as a mask to pattern the underlayer. Wafer processing may then continue according to techniques known in the art.

In another embodiment of the invention, an overcoat is used which is not removed by the developer, but which is removed during a separate removal process. With this embodiment, a semiconductor wafer having one or more underlayers thereon to be patterned is coated with a non-patterned photoresist which is then cured, for example using a bake process. Subsequently, an overcoat is formed over the photoresist and cured, for example using a bake process. With this embodiment, a material which forms the overcoat is one which is not removed by a photoresist developer used during subsequent processing. A sufficient overcoat material for this embodiment may comprise fluorinated polymer, such as fluorinated methacrylate, formed to a thickness of from between about 100 Å to about 2000 Å using, for example, a spin-coat process. Other application processes know in the art may also be sufficient.

Following exposure, the overcoat 22 is removed. If a fluorinated overcoat is used, for example TCX 041, exposing the material to 4-methyl-2-pentanol, or other organic solvent known in the art may remove the overcoat with little or no degradation of the exposed and unexposed resist. Following overcoat 22 removal, the conditions of the underlying photoresist surface are such that the probability for watermark-type defect development is reduced or eliminated. The exposed photoresist is removed using conventional techniques, and the underlayer is patterned using the photoresist as a pattern. Wafer processing continues according to techniques known in the art.

This embodiment may be advantageous over the prior overcoat embodiment for some processes because the overcoat is removed independent of the removal of the exposed resist. This may result in a process which is more controllable and provides an optional embodiment to the previous overcoat process.

In another embodiment, an overcoat as described above can be removed after application to the surface of the photoresist, but before exposure to a light source. There is no minimum time for the presence of the overcoat on the photoresist thought to be required, as long as the overcoat is sufficiently cured, for example via a bake process, prior to removal to sufficiently treat the resist surface. After the overcoat is removed the photoresist is exposed to light which is patterned by a mask, a reticle, or other techniques. Because the overcoat material is removed prior to radiation source exposure, the overcoat is not required to be transparent to the radiation wavelength used in the lithographic process. The exposed photoresist is then removed using conventional techniques, and the underlayer is patterned using the photoresist as a pattern. Wafer processing continues according to techniques known in the art.

In some uses, this process may have advantages over the overcoat embodiments described previously. For example, because the photoresist is exposed to light subsequent to removal of the overcoat, there are no optical effects on the photoresist resulting from the presence of the overcoat. Further, during removal, residual overcoat material cannot deposit into the etched openings of the underlayer, since during removal the resist has not been exposed. The formation of the overcoat results in a change to the resist, which reduces or eliminates formation of the watermark-type defects, and with this embodiment any negative process effects to the photoresist are minimized.

Figure 4A:
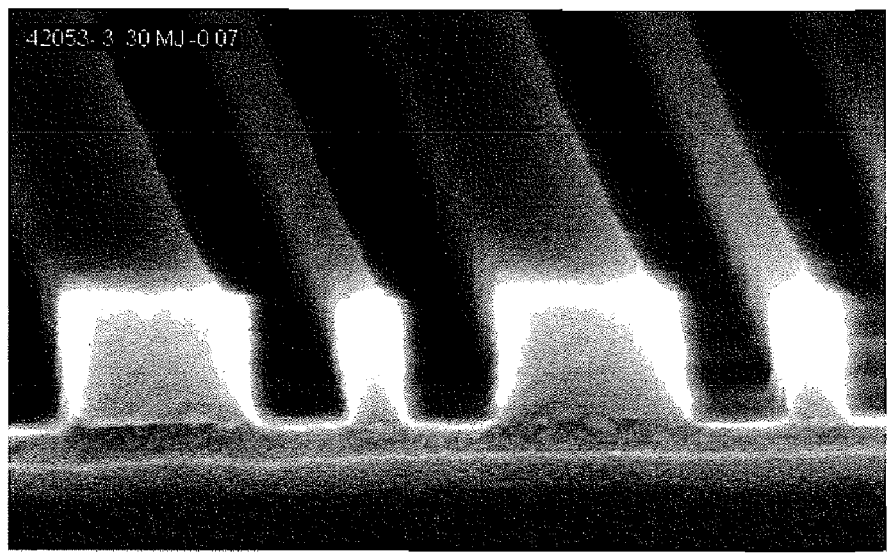
FIGS. 4a and b are micrographs of the surface of deposited photoresist prior to and following disclosed embodiments.
Figure 4B:
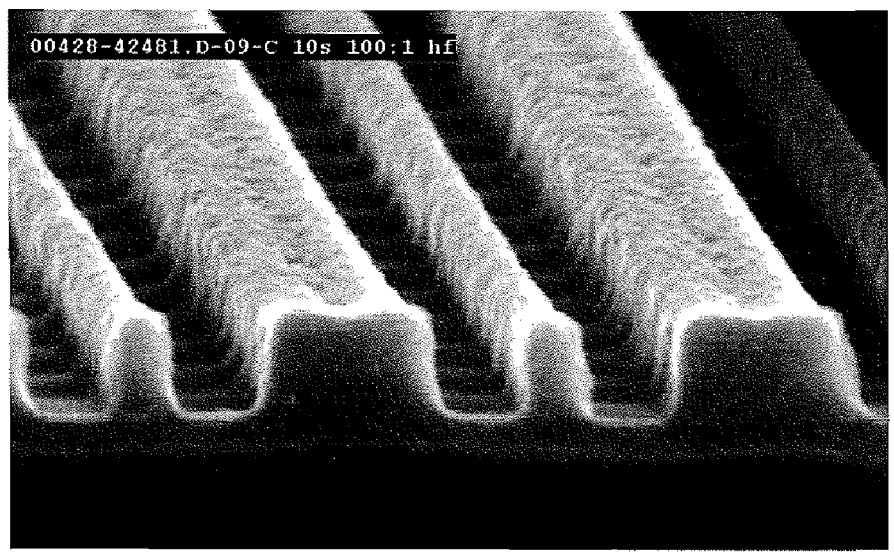

The conditions of the underlying photoresist surface following pre- or post-exposure treatment with an overcoat material are such that watermark-type defect development is reduced or eliminated. While not being held to any particular theory, it is thought that such improvements in defect reduction or elimination are likely the result of an enhancement of photoresist surface roughness. FIGS. 4a and b are electron micrographs of the surface of deposited photoresist prior to and following the disclosed treatment. The increase in surface roughness may be sufficient to disrupt the formation of described defects. While not being held to any specific theory, it is believed that the roughness is caused by chain pull-out of the polymer chains in the inter-diffused (mixed) region between the overcoat and the resist. While the treatment may affect the photoresist surface, it does not excessively degrade the patterning process of the photoresist by chemical alterations, using a mask or reticle, or patterning of the underlayer using the photoresist.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method of semiconductor processing comprising:
   forming a photoresist material on a substrate;
   treating the photoresist material with a substance prior to an exposure to a radiation source during a photolithographic process reducing the likelihood of the formation of watermark-type defects; and
   wherein the treatment act of the photoresist material with a substance is from application and removal of an overcoat material applied above and in contact with the photoresist material to increase surface roughness of the photoresist material.

2. The method of claim 1, wherein the treatment act of the photoresist material is from one or more of isopropyl alcohol, hydrofluoric acid or a buffered oxide etch.

3. The method of claim 1, wherein the treatment of the photoresist material with a substance is from two or more of isopropyl alcohol, hydrofluoric acid or buffered oxide etch.

4. A method of reducing watermark-type defects during a photolithographic process comprising:
   forming a photoresist material on a substrate;
   a first baking of the photoresist material after forming on the substrate;
   exposing the photoresist material to a radiation source;
   a second baking of the photoresist material after exposure to the radiation source;
   developing the exposed photoresist material;
   rinsing the exposed photoresist material; and
   drying the substrate;
   the method further comprising treating the photoresist material, wherein a treating act occurs prior to or after the first baking act but before exposure of the photoresist material to the radiation source and the treating act includes the application and removal of an overcoat material to increase surface roughness of the photoresist material.

5. The method of claim 4, wherein the treating act is chosen from one or more of hydrofluoric acid or a buffered oxide etch.

6. The method of claim 4, wherein the treating act occurs after the first baking act and the treating act is chosen from one or more of isopropyl alcohol, hydrofluoric acid or buffered oxide etch.

7. A photolithographic method comprising:
   applying a photoresist material to a substrate surface;
   applying an overcoat material on the photoresist material; and
   removing the overcoat material to increase surface roughness of the photoresist material prior to exposure of the photoresist to a radiation source.

8. A method of reducing watermark-type defects during a photolithographic process comprising:
   forming a photoresist material on a substrate
   baking the photoresist material;
   forming a overcoat material on the photoresist material;
   baking the overcoat material; and
   removing the overcoat material prior to an exposure of the photoresist material to a radiation source to increase surface roughness of the photoresist material.

* * * * *

UNITED STATES PATENT AND TRADEMARK OFFICE
CERTIFICATE OF CORRECTION

PATENT NO. : 8,163,468 B2
APPLICATION NO. : 12/045373
DATED : April 24, 2012
INVENTOR(S) : Yoshiki Hishiro et al.

Page 1 of 1

It is certified that error appears in the above-identified patent and that said Letters Patent is hereby corrected as shown below:

On the Title page, in field (75), in "Inventors", in column 1, line 2, delete "Bosie," and insert -- Boise, --, therefor.

Signed and Sealed this
Twenty-sixth Day of June, 2012

David J. Kappos
*Director of the United States Patent and Trademark Office*